United States Patent
Hirayama

(10) Patent No.: US 9,696,621 B2
(45) Date of Patent: Jul. 4, 2017

(54) OPTICAL WAVEGUIDE PHOTOSENSITIVE RESIN COMPOSITION INCLUDING A DIARYLIODONIUM CATION-BASED PHOTOACID GENERATOR, PHOTOCURABLE FILM FOR FORMING OPTICAL WAVEGUIDE CORE LAYER, OPTICAL WAVEGUIDE USING SAME, AND MIXED FLEXIBLE PRINTED CIRCUIT BOARD FOR OPTICAL/ELECTRICAL TRANSMISSION

(71) Applicant: NITTO DENKO CORPORATION, Ibaraki-shi, Osaka (JP)

(72) Inventor: Tomoyuki Hirayama, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/030,782

(22) PCT Filed: Oct. 24, 2014

(86) PCT No.: PCT/JP2014/078335
§ 371 (c)(1),
(2) Date: Apr. 20, 2016

(87) PCT Pub. No.: WO2015/068594
PCT Pub. Date: May 14, 2015

(65) Prior Publication Data
US 2016/0252811 A1 Sep. 1, 2016

(30) Foreign Application Priority Data
Nov. 8, 2013 (JP) ................................ 2013-231730

(51) Int. Cl.
*G02B 6/13* (2006.01)
*G03F 7/038* (2006.01)
*C08L 101/00* (2006.01)
*G02B 6/138* (2006.01)
*C08G 59/68* (2006.01)
*G02B 6/42* (2006.01)
(Continued)

(52) U.S. Cl.
CPC ............ *G03F 7/038* (2013.01); *C08G 59/68* (2013.01); *C08L 101/00* (2013.01); *G02B 6/13* (2013.01); *G02B 6/138* (2013.01); *G02B 6/4281* (2013.01); *G03F 7/0005* (2013.01); *G03F 7/0045* (2013.01); *G02B 2006/12069* (2013.01); *H05K 1/0274* (2013.01); *H05K 3/287* (2013.01)

(58) Field of Classification Search
CPC ............... G02B 6/13; G02B 6/4281; G02B 2006/12069; G02B 6/138; G03F 7/0005; G03F 7/0045; G03F 7/038; H05K 1/0274; H05K 3/287; C08G 59/68; C08L 101/00; C08L 33/66; C08K 5/37

USPC ...... 385/14, 123, 129, 141, 143; 430/280.01, 430/285.1, 321; 427/508; 156/327; 433/228.1
See application file for complete search history.

(56) References Cited

U.S. PATENT DOCUMENTS

| | | | | |
|---|---|---|---|---|
| 5,356,755 A | * | 10/1994 | Matsuda | H05K 3/0094 216/18 |
| 6,410,206 B1 | * | 6/2002 | Ueda | G03F 7/0388 430/280.1 |

(Continued)

FOREIGN PATENT DOCUMENTS

| | | |
|---|---|---|
| CN | 100393797 C | 6/2008 |
| CN | 102317372 A | 1/2012 |

(Continued)

OTHER PUBLICATIONS

International Search Report dated Jan. 6, 2015, issued in counterpart International Application No. PCT/JP2014/078335 (in English) (2 pages).

(Continued)

*Primary Examiner* — Akm Enayet Ullah
(74) *Attorney, Agent, or Firm* — Westerman, Hattori, Daniels & Adrian, LLP

(57) ABSTRACT

Provided is an optical waveguide photosensitive resin composition containing a photocurable resin and a photopolymerization initiator, in which the photopolymerization initiator is a specific photoacid generator represented by the general formula (1). Accordingly, when a core layer is formed by using the optical waveguide photosensitive resin composition as a material for forming an optical waveguide, especially a core layer-forming material, excellent high transparency (low loss effect) is obtained.

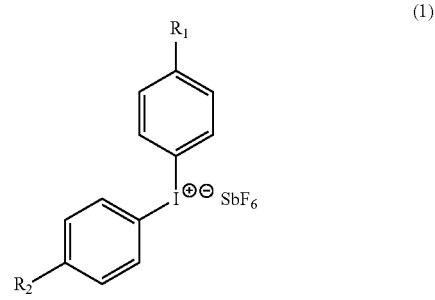

In the formula (1), $R_1$ and $R_2$ each represent hydrogen or an alkyl group having 1 to 15 carbon atoms, and may be identical to or different from each other.

8 Claims, No Drawings

(51) Int. Cl.
*G03F 7/00* (2006.01)
*G03F 7/004* (2006.01)
*H05K 1/02* (2006.01)
*H05K 3/28* (2006.01)
*G02B 6/12* (2006.01)

(56) References Cited

U.S. PATENT DOCUMENTS

| | | | | |
|---|---|---|---|---|
| 7,037,637 | B2* | 5/2006 | Mune | C08K 5/06 |
| | | | | 385/129 |
| 7,376,328 | B2* | 5/2008 | Takase | C08F 222/1006 |
| | | | | 385/143 |
| 7,569,335 | B2* | 8/2009 | Maeda | G02B 1/045 |
| | | | | 385/131 |
| 8,623,512 | B2* | 1/2014 | Pyun | C08G 59/621 |
| | | | | 156/330 |
| 8,642,250 | B2* | 2/2014 | Hirayama | G02B 6/1221 |
| | | | | 430/320 |
| 9,034,566 | B2* | 5/2015 | Hirayama | C09D 137/00 |
| | | | | 385/129 |
| 2004/0076391 | A1 | 4/2004 | Ghoshal et al. | |
| 2004/0192804 | A1* | 9/2004 | Kura | C07D 295/112 |
| | | | | 522/65 |
| 2005/0265685 | A1 | 12/2005 | Ohashi et al. | |
| 2008/0260341 | A1* | 10/2008 | Shibata | C08F 2/50 |
| | | | | 385/129 |
| 2009/0223626 | A1* | 9/2009 | Hikita | G02B 6/1221 |
| | | | | 156/250 |
| 2011/0123929 | A1* | 5/2011 | Fujita | C07C 251/66 |
| | | | | 430/281.1 |
| 2011/0286713 | A1 | 11/2011 | Mori et al. | |
| 2012/0114294 | A1* | 5/2012 | Fujisawa | G02B 6/138 |
| | | | | 385/129 |
| 2012/0155819 | A1 | 6/2012 | Hirayama et al. | |
| 2013/0163941 | A1* | 6/2013 | Hirayama | C09D 137/00 |
| | | | | 385/129 |
| 2014/0076391 | A1* | 3/2014 | King | H01L 31/0725 |
| | | | | 136/255 |

FOREIGN PATENT DOCUMENTS

| | | |
|---|---|---|
| CN | 102566272 B | 4/2015 |
| JP | 2009-8965 A | 1/2009 |
| JP | 2009-015085 A | 1/2009 |
| JP | 2010-84150 A | 4/2010 |
| JP | 2010-230944 A | 10/2010 |
| WO | 2010/110495 A1 | 9/2010 |

OTHER PUBLICATIONS

Notification of Transmittal of Translation of the International Preliminary Report on Patentability (Form PCT/IB/338) issued in counterpart International Application No. PCT/JP2014/078335 mailed May 19, 2016 with Forms PCT/IB/373 and PCT/ISA/237. (9 pages).

Office Action dated Jan. 24, 2017, issued in counterpart Chinese Patent Application No. 201480055026.4, with English translation. (12 pages).

* cited by examiner

OPTICAL WAVEGUIDE PHOTOSENSITIVE RESIN COMPOSITION INCLUDING A DIARYLIODONIUM CATION-BASED PHOTOACID GENERATOR, PHOTOCURABLE FILM FOR FORMING OPTICAL WAVEGUIDE CORE LAYER, OPTICAL WAVEGUIDE USING SAME, AND MIXED FLEXIBLE PRINTED CIRCUIT BOARD FOR OPTICAL/ELECTRICAL TRANSMISSION

TECHNICAL FIELD

The present invention relates to an optical waveguide photosensitive resin composition and a photocurable film for forming an optical waveguide core layer each of which is to be used as a material for forming, for example, a core layer constituting an optical waveguide in a mixed flexible printed circuit board for optical/electrical transmission to be widely used in optical communication, optical information processing, and any other general optics, an optical waveguide using the composition or the film, and a mixed flexible printed circuit board for optical/electrical transmission.

BACKGROUND ART

An epoxy resin-based photosensitive resin composition has heretofore been used as an optical waveguide core layer-forming material intended for a mixed flexible printed circuit board for optical/electrical transmission, and in formation of the pattern of a core layer using the composition, a desired core pattern has been produced by performing photoirradiation through a photomask. In the patterning through the curing of such core layer-forming material, a curing reaction through irradiation with an i-line (wavelength: 365 nm) has been generally performed, and for example, a photoacid generator having a triphenylsulfonium cation having a wide π-conjugated area of a cation moiety has been used for the purpose of improving the sensitivity of the material.

However, the use of such photoacid generator as described above shows the following tendency. A by-product (dead body) to be incorporated after the photo fragmentation of the photoacid generator itself also has a wide conjugated area and absorbs light in a short-wavelength region, and hence an optical waveguide loss increases. The foregoing tendency has been a technical problem involved in an optical waveguide material using a photocurable resin (Patent Literature 1).

RELATED ART DOCUMENT

Patent Document

[PTL 1] JP-A-2010-230944

SUMMARY OF INVENTION

A method of solving the technical problem is, for example, as described below. When a blend system using no photoacid generator is produced by using a thermosetting resin or a thermoplastic resin instead of the photocurable resin, the technical problem can be avoided. However, when, for example, the maintenance of the degree of freedom in pattern design of an optical waveguide is considered, a blend system using a photocurable resin is preferably used as in the past. From such viewpoint, a core layer-forming material that is of a blend system using a photocurable resin and can reduce an optical loss has been strongly required.

The present invention has been made in view of such circumstances, and an object of the present invention is to provide an optical waveguide photosensitive resin composition and a photocurable film for forming an optical waveguide core layer each serving as a material for forming an optical waveguide, especially a core layer-forming material, the composition and the film being each capable of reducing a loss at a wavelength of, for example, 850 nm serving as the wavelength of light propagating through an optical waveguide, an optical waveguide using the composition or the film, and a mixed flexible printed circuit board for optical/electrical transmission.

In order to achieve the above-mentioned object, according to a first aspect of the present invention, there is provided an optical waveguide photosensitive resin composition, including: a photocurable resin; and a photopolymerization initiator, in which the photopolymerization initiator includes a photoacid generator represented by the following general formula (1):

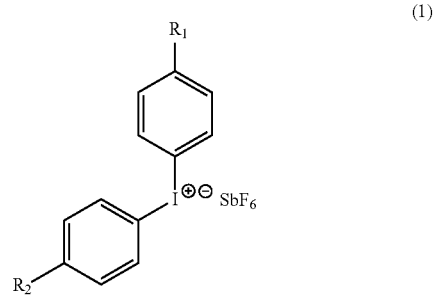

in the formula (1), $R_1$ and $R_2$ each represent hydrogen or an alkyl group having 1 to 15 carbon atoms, and may be identical to or different from each other.

Further, according to a second aspect of the present invention, there is provided a photocurable film for forming an optical waveguide core layer, which is obtained by forming the optical waveguide photosensitive resin composition of the first aspect into a film shape.

Further, according to a third aspect of the present invention, there is provided an optical waveguide, including: a base material; a cladding layer formed on the base material; and a core layer configured to propagate an optical signal, the core layer being formed in the cladding layer in a predetermined pattern, in which the core layer is formed by curing the optical waveguide photosensitive resin composition of the first aspect or the photocurable film for forming an optical waveguide core layer of the second aspect.

Further, a fourth aspect of the present invention resides in a mixed flexible printed circuit board for optical/electrical transmission, including the optical waveguide of the third aspect.

The inventor of the present invention has made extensive investigations for obtaining a photosensitive resin composition serving as an optical waveguide core layer-forming material having high transparency, i.e., capable of realizing a reduction in loss. As a result, the inventor has found that the expected object is achieved by using the photoacid generator represented by the general formula (1) as a photopolymerization initiator, and thus has reached the present invention.

A photoacid generator having a triphenylsulfonium skeleton having a wide π-conjugated skeleton having such sensitivity that the generator generates an acid through light irradiation has heretofore been used in a general optical waveguide core layer-forming material for imparting the property by Which the material is patterned through photocuring. However, in the photoacid generator having such skeleton, the peak of short-wavelength absorption extends shifts to a long-wavelength region to hinder a reduction in loss. That is, the mechanism via which the heat deterioration (coloring) of a cured product occurs is derived from the occurrence of a π-conjugated extension factor caused by the oxidation deterioration of a resin. As a guideline on the selection of a photoacid generator in the blending design of a photocurable resin, a photoacid generator having a cation skeleton (e.g., a triphenylsulfonium salt-based skeleton) having a relatively wide π-conjugated system to which sensitivity to an exposure wavelength of 365 nm is imparted has heretofore been adopted from the viewpoint of the patterning property. However, the wide π-conjugated skeleton is a factor for the fact that the coloring is liable to occur owing to the extension of the π-conjugated system in the oxidation deterioration of a cation residue (dead body) after the generation of an acid. Accordingly, the inventor has found that a diphenyliodonium cation-based photoacid generator is suitably used, which is useful for the high transparency (low loss).

In the present invention, the diphenyliodonium cation-based photoacid generator represented by the general formula (1) is used as a photoacid generator, and hence sensitivity to an exposure wavelength of 365 nm is absent and mixed beam exposure (broad light) is needed. However, a cured product to be obtained is harder to color than a cured product using the triphenylsulfonium salt-based photoacid generator that has heretofore been used is, and hence high transparency (low loss) can be imparted.

As described above, the present invention is the optical waveguide photosensitive resin composition containing the photoacid generator represented by the general formula (1). Accordingly, when, for example, the core layer of an optical waveguide is formed by using the optical waveguide photosensitive resin composition, excellent high transparency (low loss) is obtained.

In addition, when the content of the photopolymerization initiator falls within a specific range, satisfactory photocurability is obtained, and an additionally excellent patterning property and a required physical property concerning an initial loss are obtained.

DESCRIPTION OF EMBODIMENTS

Next, an embodiment of the present invention is described in detail. However, the present invention is not limited to the embodiment.

<<Optical Waveguide Photosensitive Resin Composition>>

An optical waveguide photosensitive resin composition (hereinafter sometimes simply referred to as "photosensitive resin composition") of the embodiment of the present invention is obtained by using a photopolymerizable resin and a specific photopolymerization initiator. A feature in the embodiment of the present invention lies in that a photoacid generator to be described later is used as the specific photopolymerization initiator. It should be noted that in the embodiment of the present invention, the term "liquid" or "solid" means that a substance shows a "liquid" or "solid" state under a temperature of 25° C.

Various components are sequentially described below.

<Photopolymerizable Resin>

The photopolymerizable resin is, for example, an aromatic resin that has heretofore been used. In addition, a resin showing a solid state at room temperature is preferably used as the aromatic resin.

Examples of the aromatic resin include a bisphenol A-type epoxy resin, a cresol novolac-type epoxy resin, a fluorene skeleton-containing epoxy resin, a special novolac-type epoxy resin (such as 157S70 manufactured by Mitsubishi Chemical Corporation), and a styrene-based epoxy resin (such as MARPROOF G-0250SP manufactured by NOF Corporation). One kind of those resins is used alone, or two or more kinds thereof are used in combination.

The cresol novolac-type epoxy resin shows a solid state at room temperature, and is, for example, a cresol novolac-type epoxy resin represented by the following general formula (2).

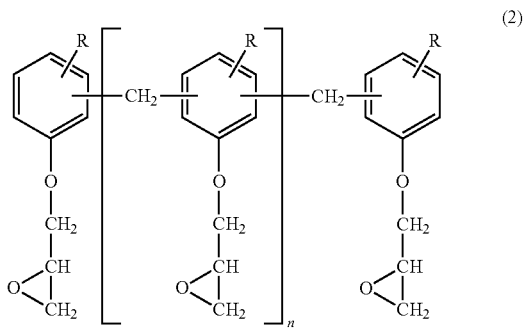

[In the formula (2), R's each represent an alkyl group having 1 to 6 carbon atoms, and may be identical to or different from one another, and n represents a positive number.]

In the formula (2), it is preferred that all R's represent a methyl group.

Specific examples of the cresol novolac-type epoxy resin represented by the general formula (2) include YDCN-704A, YDCN-700-10, YDCN-700-7, and YDCN-700-5 (all of which are manufactured by Nippon Steel & Sumikin Chemical Co., Ltd.). One kind of those resins is used alone, or two or more kinds thereof are used in combination.

In addition, the fluorene skeleton-containing epoxy resin is, for example, a liquid epoxy resin having a fluorene skeleton on its main chain. The liquid epoxy resin shows a liquid state at room temperature, and is, for example, an epoxy resin represented by the following general formula (3).

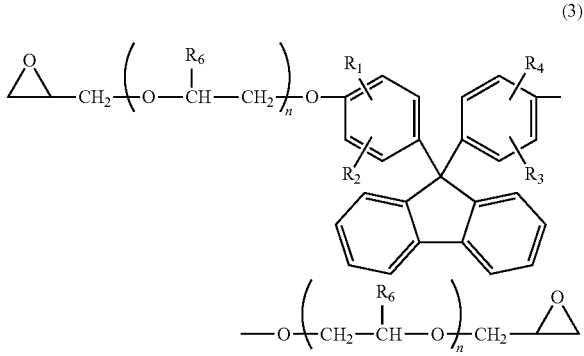

[In the formula (3), $R_1$ to $R_4$ each represent a hydrogen atom or an alkyl group having 1 to 6 carbon atoms, and may be identical to or different from one another, $R_5$ and $R_6$ each represent a hydrogen atom or a methyl group, and may be identical to or different from each other, and n's each independently represent an integer of from 0 to 10.]

In the formula (3), $R_1$ to $R_6$ each preferably represent a hydrogen atom, and such resin is specifically, for example, OGSOL EG-200 (manufactured by Osaka Gas Chemicals Co., Ltd.).

<Specific Photopolymerization Initiator>

The specific photopolymerization initiator is used for imparting, to the photosensitive resin composition, the property by which the composition is cured through light irradiation. In addition, in the embodiment of the present invention, a photoacid generator represented by the following general formula (1) is used as the specific photopolymerization initiator.

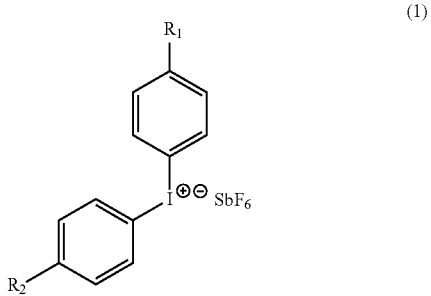

[In the formula (1), $R_1$ and $R_2$ each represent hydrogen or an alkyl group having 1 to 15 carbon atoms, and may be identical to or different from each other.]

In the formula (1), $R_1$ and $R_2$ each represent preferably an alkyl group having 1 to 15 carbon atoms, particularly preferably a mixture having an alkyl group having 10 to 13 carbon atoms. The photoacid generator is specifically, for example, an iodonium salt-type photopolymerization initiator, such as WPI-116 (manufactured by Wako Pure Chemical Industries, Ltd.).

The content of the specific photopolymerization initiator [the photoacid generator represented by the general formula (1)] is set to preferably from 0.1 part by weight to 3 parts by weight, more preferably from 0.5 part by weight to 1 part by weight with respect to 100 parts by weight of the resin component (photopolymerizable resin) of the photosensitive resin composition. That is, when the content of the specific photopolymerization initiator is excessively small, satisfactory photocurability by which the composition is cured through light irradiation (ultraviolet irradiation) is hardly obtained. When the content is excessively large, the following tendency is observed: the photosensitivity of the composition rises and hence its shape becomes abnormal upon its patterning. In addition, the following tendency is observed: a required physical property concerning an initial loss deteriorates.

It should be noted that in the embodiment of the present invention, the following embodiment is particularly preferred: only the photoacid generator represented by the general formula (1) is used. However, a photoacid generator that has heretofore been used can be used in combination with the photoacid generator represented by the general formula (1) to the extent that the effects of the embodiment of the present invention are not impaired. Examples of such photoacid generator include triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-(diphenylsulfonio)phenyl]sulfide bishexafluorophosphate, bis[4-(diphenylsulfonio)phenyl]sulfide bishexafluoroantimonate, and (2,4-cyclopentadie-1-yl) [(1-methylethyl)benzene]-Fe-hexafluorophosphate. The content of all of photopolymerization initiators when the photoacid generator that has heretofore been used is used in combination with the photoacid generator represented by the general formula (1) is in conformity with the content when only the photoacid generator represented by the general formula (1) is used.

For example, the following additives are given as additives to be used as required in the photosensitive resin composition of the embodiment of the present invention in addition to the photopolymerizable resin and the specific photopolymerization initiator: adhesiveness-imparting agents for enhancing an adhesive property, such as a silane-based or titanium-based coupling agent, an olefin-based oligomer, a cycloolefin-based oligomer or polymer, e.g., a norbornene-based polymer, synthetic rubber, and a silicone compound; various antioxidants, such as a hindered phenol-based antioxidant and a phosphorus-based antioxidant; a sensitizer, such as an anthracene-based or thioxanthone-based sensitizer; a leveling agent; and an antifoaming agent. Those additives are each appropriately blended to the extent that the effects in the embodiment of the present invention are not impaired. One kind of those additives can be used alone, or two or more kinds thereof can be used in combination.

The blending amount of the antioxidant is set to preferably less than 3 parts by weight, particularly preferably from 0.5 part by weight to 1 part by weight or less with respect to 100 parts by weight of the resin component of the photosensitive resin composition (photopolymerizable resin). That is, when the content of the antioxidant is excessively large, the following tendency is observed: the required physical property concerning the initial loss deteriorates.

The photosensitive resin composition of the embodiment of the present invention can be prepared by stirring and mixing the photopolymerizable resin and the specific photopolymerization initiator, and as required, any other additive at predetermined blending ratios. Further, the materials may be stirred and dissolved in an organic solvent under heating (e.g., at from about 60° C. to about 90° C.) so that the photosensitive resin composition of the embodiment of the present invention may be prepared as a varnish for application. The usage amount of the organic solvent, which is appropriately adjusted, is set to, for example, preferably from 20 parts by weight to 80 parts by weight, particularly preferably from 30 parts by weight to 50 parts by weight with respect to 100 parts by weight of the resin component of the photosensitive resin composition (photopolymerizable resin). That is, when the usage amount of the organic solvent is excessively small, the following tendency is observed: the viscosity of the composition prepared as the varnish for application increases and hence its applicability reduces. When the usage amount of the organic solvent is excessively large, the following tendency is observed: it becomes difficult to apply and form the varnish for application into a thick film.

Examples of the organic solvent to be used in preparing the varnish for application include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents is used alone, or two or more kinds thereof are used in combination, in, for example, a predetermined amount in the above-mentioned range so that viscosity suitable for application may be obtained.

<<Optical Waveguide>>

Next, an optical waveguide obtained by using the photosensitive resin composition of the embodiment of the present invention as a material for forming its core layer is described.

The optical waveguide obtained by the embodiment of the present invention includes, for example: a base material; a cladding layer (undercladding layer) formed on the base material in a predetermined pattern; a core layer configured to propagate an optical signal, the core layer being formed on the cladding layer in a predetermined pattern; and a cladding layer (overcladding layer) formed on the core layer. In addition, the optical waveguide obtained by the embodiment of the present invention is characterized in that the core layer is formed of the photosensitive resin composition. In addition, with regard to a material for forming the undercladding layer and a material for forming the overcladding layer, resin compositions for forming cladding layers formed of the same component composition may be used, or resin compositions of different component compositions may be used. It should be noted that in the optical waveguide obtained by the embodiment of the present invention, the cladding layers each need to be formed so as to have a refractive index smaller than that of the core layer.

In the embodiment of the present invention, the optical waveguide can be produced through, for example, the following steps. That is, the base material is prepared and a photosensitive varnish formed of a photosensitive resin composition serving as a cladding layer-forming material is applied onto the base material. The photosensitive varnish is cured by irradiating the varnish-applied surface with light, such as ultraviolet light, and subjecting the surface to a heat treatment as required. Thus, the undercladding layer (the lower portion of the cladding layers) is formed.

Next, an uncured layer for forming a core is formed by applying, onto the undercladding layer, a core layer-forming material (photosensitive varnish) obtained by dissolving the photosensitive resin composition of the embodiment of the present invention in an organic solvent. At this time, after having been applied, the core layer-forming material (photosensitive varnish) is formed into a film shape serving as an uncured photocurable film for forming an optical waveguide core layer by heating and drying the organic solvent to remove the solvent. Then, a photomask for exposing a predetermined pattern (optical waveguide pattern) is arranged on the surface of the uncured layer for forming a core, and the surface is irradiated with light, such as ultraviolet light, through the photomask and subjected to a heat treatment as required. After that, the core layer of the predetermined pattern is formed by dissolving and removing the unexposed portion of the uncured layer for forming a core with a developing solution.

Next, the photosensitive varnish formed of the photosensitive resin composition serving as the cladding layer-forming material is applied onto the core layer. After that, the overcladding layer (the upper portion of the cladding layers) is formed by irradiating the varnish with light, such as ultraviolet light, and subjecting the varnish to a heat treatment as required. The target optical waveguide can be produced through such steps.

A material for the base material is, for example, a silicon wafer, a metallic substrate, a polymer film, or a glass substrate. In addition, the metallic substrate is, for example, a stainless steel plate, such as SUS. In addition, the polymer film is specifically, for example, a polyethylene terephthalate (PET) film, a polyethylene naphthalate film, or a polyimide film. In addition, its thickness is typically set to fall within the range of from 10 μm to 3 mm.

In the light irradiation, ultraviolet irradiation is specifically performed. A light source for ultraviolet light in the ultraviolet irradiation is, for example, a low-pressure mercury lamp, a high-pressure mercury lamp, or an ultra-high pressure mercury lamp. In addition, the dose of the ultraviolet light is, for example, typically from 10 $mJ/cm^2$ to 20,000 $mJ/cm^2$, preferably from 100 $mJ/cm^2$ to 15,000 $mJ/cm^2$, more preferably from about 500 $mJ/cm^2$ to about 10,000 $mJ/cm^2$.

After the exposure by the ultraviolet irradiation, a heat treatment may be further performed for completing curing by a photoreaction. In ordinary cases, the heat treatment is performed under the conditions of a temperature in the range of from 80° C. to 250° C., preferably from 100° C. to 150° C. and a time in the range of from 10 seconds to 2 hours, preferably from 5 minutes to 1 hour.

In addition, an example of the cladding layer-forming material is a resin composition appropriately containing any of various liquid epoxy resins and solid epoxy resins, such as a bisphenol A-type epoxy resin, a bisphenol F-type epoxy resin, a hydrogenated bisphenol A-type epoxy resin, a fluorinated epoxy resin, and an epoxy-modified silicone resin, and any of the various photoacid generators described above. The resin composition is appropriately subjected to blending design for achieving a lower refractive index than that of the core layer-forming material. Further, in order that the cladding layer-forming material may be prepared and applied as a varnish as required, various conventionally known organic solvents may each be used in an appropriate amount so that viscosity suitable for application may be obtained, and various additives (an antioxidant, an adhesiveness-imparting agent, a leveling agent, and a UV absorber) may each be used in an appropriate amount to the extent that the function of the optical waveguide using the core layer-forming material is not reduced.

As described above, examples of the organic solvent to be used for preparing the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethylether, tetramethylfuran, and dimethoxyethane. One kind of those organic solvents is used alone, or two or more kinds thereof are used in combination, in an appropriate amount so that viscosity suitable for application may be obtained.

It should be noted that, for example, the following methods can each be employed as an application method involving using a material for forming each layer on the base material: an application method involving using a spin coater, a coater, a circular coater, a bar coater, or the like; a method involving forming a gap by means of screen printing or a spacer and injecting the material into the gap on the basis of a capillary phenomenon; and a method involving continuously applying the material with a coater, such as a multicoater, in a roll-to-roll (R-to-R) fashion. In addition, the optical waveguide can be turned into a film-like optical waveguide by peeling and removing the base material.

The optical waveguide thus obtained can be used as, for example, an optical waveguide for a mixed flexible printed circuit board for optical/electrical transmission.

EXAMPLES

Next, the present invention is described by way of Examples. However, the present invention is not limited to these Examples. It should be noted that in Examples, the term "part(s)" means "part(s) by weight" unless otherwise stated.

Example 1

A photosensitive varnish serving as a core layer-forming material was prepared as described below.

<Preparation of Core Layer-Forming Material>

Under a light-shielding condition, 100 parts of a cresol novolac-type polyfunctional epoxy resin (YDCN-700-10, manufactured by Nippon Steel & Sumikin Chemical Co., Ltd.), 1 part of a photoacid generator (WPI-116, manufactured by Wako Pure Chemical Industries, Ltd.: in the formula (1), $R_1$ and $R_2$ each represented a mixture having an alkyl group having 10 to 13 carbon atoms), 0.5 part of a hindered phenol-based antioxidant (SONGNOX 1010, manufactured by Kyodo Chemical Co., Ltd.), and 0.5 part of a phosphorus-based antioxidant (HCA, manufactured by Sanko Co., Ltd.) were mixed in 40 parts of ethyl lactate, and were stirred and completely dissolved under heating at 85° C. After that, the solution was cooled to room temperature (25° C.), and was then filtered under heat and pressure with a membrane filter having a diameter of 1.0 μm to prepare a photosensitive varnish serving as a core layer-forming material.

Example 2

In the preparation of the photosensitive varnish serving as the core layer-forming material, 100 parts of a bisphenol A-type epoxy resin (EPICOAT 1002, manufactured by Mitsubishi Chemical Corporation) was used as an aromatic resin. A photosensitive varnish serving as a core layer-forming material was prepared in the same manner as in Example 1 except the foregoing.

Example 3

In the preparation of the photosensitive varnish serving as the core layer-forming material, 100 parts of a fluorene skeleton-containing epoxy resin (OGSOLEG-200, manufactured by Osaka Gas Chemicals Co., Ltd.) was used as an aromatic resin, and the blending amount of ethyl lactate was changed to 30 parts. A photosensitive varnish serving as a core layer-forming material was prepared in the same manner as in Example 1 except the foregoing.

Example 4

In the preparation of the photosensitive varnish serving as the core layer-forming material, 100 parts of a liquid bisphenol A-type epoxy resin (JER 828, manufactured by Mitsubishi Chemical Corporation) was used as an aromatic resin, and the blending amount of ethyl lactate was changed to 20 parts. A photosensitive varnish serving as a core layer-forming material was prepared in the same manner as in Example 1 except the foregoing.

Example 5

In the preparation of the photosensitive varnish serving as the core layer-forming material, a system using 50 parts of a cresol novolac-type polyfunctional epoxy resin (YDCN-700-10, manufactured by Nippon Steel & Sumikin Chemical Co., Ltd.) and 50 parts of a bisphenol A-type epoxy resin (EPICOAT 1002, manufactured by Mitsubishi Chemical Corporation) in combination was used as aromatic resins. A photosensitive varnish serving as a core layer-forming material was prepared in the same manner as in Example 1 except the foregoing.

Example 6

In the preparation of the photosensitive varnish serving as the core layer-forming material, a system using 50 parts of a cresol novolac-type polyfunctional epoxy resin (YDCN-700-10, manufactured by Nippon Steel & Sumikin Chemical Co., Ltd.) and 50 parts of a solid epoxy resin (OGSOL EG-200, manufactured by Osaka Gas Chemicals Co., Ltd.) in combination was used as aromatic resins. A photosensitive varnish serving as a core layer-forming material was prepared in the same manner as in Example 1 except the foregoing.

Examples 7 and 8

In the preparation of the photosensitive varnish serving as the core layer-forming material, the blending amount of the photoacid generator was changed to 0.1 part (Example 7) and 3 parts (Example 8), respectively. Photosensitive varnishes serving as core layer-forming materials were prepared in the same manner as in Example 1 except the foregoing.

Comparative Example 1

In the preparation of the photosensitive varnish serving as the core layer-forming material, a photoacid generator (SP-170, manufactured by ADEKA Corporation) was used instead of the photoacid generator (WPI-116, manufactured by Wako Pure Chemical Industries, Ltd.). A photosensitive varnish serving as a core layer-forming material was prepared in the same manner as in Example 1 except the foregoing.

Comparative Example 2

In the preparation of the photosensitive varnish serving as the core layer-forming material, a photoacid generator (SP-170, manufactured by ADEKA Corporation) was used instead of the photoacid generator (WPI-116, manufactured by Wako Pure Chemical Industries, Ltd.). A photosensitive varnish serving as a core layer-forming material was prepared in the same manner as in Example 2 except the foregoing.

Comparative Example 3

In the preparation of the photosensitive varnish serving as the core layer-forming material, a photoacid generator (SP-170, manufactured by ADEKA Corporation) was used instead of the photoacid generator (WPI-116, manufactured by Wako Pure Chemical Industries, Ltd.). A photosensitive varnish serving as a core layer-forming material was prepared in the same manner as in Example 3 except the foregoing.

Comparative Example 4

In the preparation of the photosensitive varnish serving as the core layer-forming material, a photoacid generator (SP-170, manufactured by ADEKA Corporation) was used instead of the photoacid generator (WPI-116, manufactured by Wako Pure Chemical Industries, Ltd.). A photosensitive varnish serving as a core layer-forming material was prepared in the same manner as in Example 4 except the foregoing.

A loss evaluation (material loss) was performed by using each of the photosensitive varnishes serving as the core layer-forming materials thus obtained in accordance with the following method. The results of the evaluation are shown in Table 1 and Table 2 to be described later together with the blending composition of each of the core layer-forming materials.

[Loss Evaluation (Material Loss)]

Each of the photosensitive varnishes obtained in Examples and Comparative Examples described above was applied onto a silicon substrate with an oxide film (thickness: about 500 µm) by a spin coating method so as to have a thickness of from about 5 µm to about 10 µm. Next, the applied varnish was prebaked (100° C.×5 minutes) on a hot plate, and was then exposed to mixed beams (broad light) at 5,000 mJ (integrated at a wavelength of 365 nm), followed by post-heating (120° C.×5 minutes). Thus, a thin film was formed. Next, light having a wavelength of 850 nm was caused to enter the thin film by prism coupling, and was propagated through the thin film. Then, a propagation length was changed, and an optical intensity at the length was measured with an optical measuring system (Optical Multipower Meter Q8221, manufactured by Advantest Corporation). An optical loss was plotted against the propagation length, and the resultant graph was approximated to a straight line. A material loss in each photosensitive varnish was calculated from the gradient of the straight line, and was evaluated on the basis of the following criteria (a prism coupler method).

o: The material loss was 0.04 dB/cm or less.
x: The result was that the material loss exceeded 0.04 dB/cm.

TABLE 1

| | | Example (Part(s)) | | | | | | | |
|---|---|---|---|---|---|---|---|---|---|
| | | 1 | 2 | 3 | 4 | 5 | 6 | 7 | 8 |
| Aromatic resin | YDCN-700-10 | 100 | — | — | — | 50 | 50 | 100 | 100 |
| | EPICOAT 1002 | — | 100 | — | — | 50 | — | — | — |
| | OGSOL EG-200 | — | — | 100 | — | — | 50 | — | — |
| | JER 828 | — | — | — | 100 | — | — | — | — |
| Photoacid generator | WPI-116 | 1 | 1 | 1 | 1 | 1 | 1 | 0.1 | 3 |
| | SP-170 | — | — | — | — | — | — | — | — |
| Antioxidant | Songnox 1010 | 0.5 | 0.5 | 0.5 | 0.5 | 0.5 | 0.5 | 0.5 | 0.5 |
| | HCA | 0.5 | 0.5 | 0.5 | 0.5 | 0.5 | 0.5 | 0.5 | 0.5 |
| Ethyl lactate (organic solvent) | | 40 | 40 | 30 | 20 | 40 | 40 | 40 | 40 |
| Loss evaluation | | o | o | o | o | o | o | o | o |
| Material loss (dB/cm) | | 0.03 | 0.03 | 0.04 | 0.04 | 0.03 | 0.03 | 0.03 | 0.04 |

TABLE 2

| | | Comparative Example (Part(s)) | | | |
|---|---|---|---|---|---|
| | | 1 | 2 | 3 | 4 |
| Aromatic resin | YDCN-700-10 | 100 | — | — | — |
| | EPICOAT 1002 | — | 100 | — | — |
| | OGSOL EG-200 | — | — | 100 | — |
| | JER 828 | — | — | — | 100 |
| Photoacid generator | WPI-116 | — | — | — | — |
| | SP-170 | 1 | 1 | 1 | 1 |
| Antioxidant | Songnox 1010 | 0.5 | 0.5 | 0.5 | 0.5 |
| | HCA | 0.5 | 0.5 | 0.5 | 0.5 |
| Ethyl lactate (organic solvent) | | 40 | 40 | 30 | 20 |
| Loss evaluation | | x | x | x | x |
| Material loss (dB/cm) | | 0.06 | 0.05 | 0.06 | 0.06 |

As can be seen from the foregoing results, a photosensitive resin composition using the specific photoacid generator represented by the general formula (1) as a photoacid generator (a product of Examples) provided a satisfactory evaluation result in the loss evaluation (material loss).

In contrast, a photosensitive resin composition using the conventional photoacid generator (a product of Comparative Examples) provided a poor evaluation result in the loss evaluation (material loss).

[Production of Optical Waveguide]

Next, an optical waveguide was produced by using each of the photosensitive varnishes serving as the core layer-forming materials of Examples described above. First, prior to the production of the optical waveguide, a photosensitive varnish serving as a cladding layer-forming material was prepared.

<Preparation of Cladding Layer-Forming Material>

Under a light-shielding condition, 50 parts of a liquid bifunctional fluoroalkyl epoxy resin (H022, manufactured by Tosoh F-Tech, Inc.), 50 parts of a liquid bifunctional alicyclic epoxy resin (CELLOXIDE 2021P, manufactured by Daicel Corporation), 4.0 parts of a photoacid generator (ADEKAOPTOMER SP-170, manufactured by ADEKA Corporation), 0.54 part of a phosphorus-based antioxidant (HCA, manufactured by Sanko Co., Ltd.), and 1 part of a silane coupling agent (KBM-403, manufactured by Shin-Etsu Silicones) were mixed, and were stirred and completely dissolved under heating at 80° C. After that, the solution was cooled to room temperature (25° C.), and was then filtered under heat and pressure with a membrane filter having a diameter of 1.0 μm to prepare the photosensitive varnish serving as the cladding layer-forming material.

<<Production of Optical Waveguide>>
<Production of Undercladding Layer>

The photosensitive varnish serving as the cladding layer-forming material was applied onto a silicon wafer having a thickness of about 500 μm with a spin coater, followed by exposure to mixed beams (broad light) at 5,000 mJ (integrated at a wavelength of 365 nm). After that, the resultant was post-heated at 130° C. for 10 minutes to produce an undercladding layer (thickness: 20 μm).

<Production of Core Layer>

The photosensitive varnish serving as the core layer-forming material (the product of Example 1) was applied onto the formed undercladding layer with a spin coater, and then the organic solvent (ethyl lactate) was dried (130° C.×5 minutes) on a hot plate. Thus, an uncured layer in an uncured film state was formed. The formed uncured layer was subjected to mask pattern exposure [pattern width/pattern interval (L/S)=50 μm/200 μm] to mixed beams (broad light) at 9,000 mJ (integrated at a wavelength of 365 nm), and was post-heated (140° C.×5 minutes). After that, the resultant was developed (25° C.×3 minutes) in N,N-dimethylacetamide (DMAc) and washed with water, and moisture was dried (120° C.×5 minutes) on a hot plate. Thus, a core layer of a predetermined pattern (thickness: 55 μm) was produced.

Thus, the optical waveguide in which the undercladding layer was formed on the silicon wafer and the core layer of the predetermined pattern was formed on the undercladding layer was produced. The produced optical waveguide caused no problems in the production process and was satisfactory.

A specific mode in the present invention has been described in Examples described above, but Examples described above are merely illustrative and should not be construed as being limitative. Various modifications apparent to a person skilled in the art are meant to fall within the scope of the present invention.

The optical waveguide photosensitive resin composition of the present invention is useful as a material for forming a component of an optical waveguide, in particular, a core layer-forming material. In addition, an optical waveguide produced by using the optical waveguide photosensitive resin composition is used in, for example, a mixed flexible printed circuit board for optical/electrical transmission.

The invention claimed is:

1. An optical waveguide photosensitive resin composition, comprising:
   a photocurable resin; and
   a photopolymerization initiator,
   wherein the photocurable resin comprises at least one of:
      a cresol novolac-type epoxy resin represented by the following general formula (2) and an epoxy resin represented by the following general formula (3);
   wherein the photopolymerization initiator comprises a photoacid generator represented by the following general formula (1); and
   wherein a content of the photopolymerization initiator is from 0.5 part by weight to 1 part by weight with respect to 100 parts by weight of the photocurable resin:

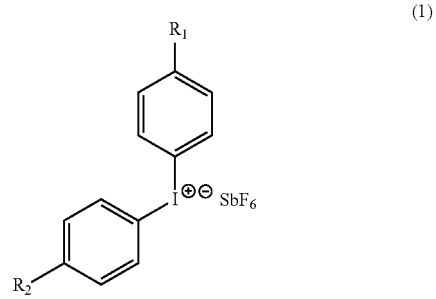

in the formula (1), $R_1$ and $R_2$ each represent hydrogen group or an alkyl group having 1 to 15 carbon atoms, and are identical to or different from each other;

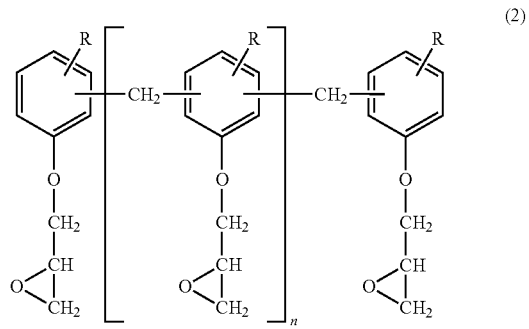

in the formula (2), R's each represent an alkyl group having 1 to 6 carbon atoms, and are identical to or different from one another, and n represents a positive number; and

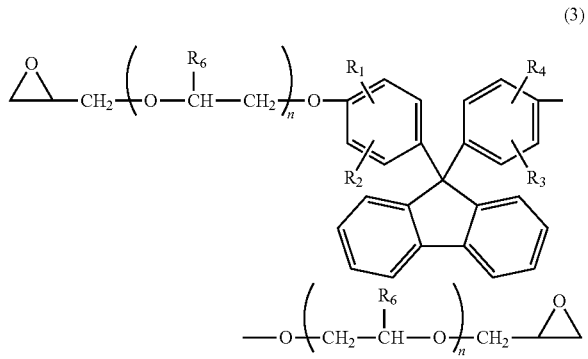

in the formula (3), $R_1$ to $R_4$ each represent a hydrogen atom or an alkyl group having 1 to 6 carbon atoms, and are identical to or different from one another, $R_5$ and $R_6$ each represent a hydrogen atom or a methyl group, and are identical to or different from each other, and n's each independently represent an integer of from 0 to 10.

2. The optical waveguide photosensitive resin composition according to claim 1, wherein the photocurable resin is in a solid state at 25° C.

3. The optical waveguide photosensitive resin composition according to claim 1, wherein the optical waveguide photosensitive resin composition is a core layer-forming material in an optical waveguide including a base material, a cladding layer formed on the base material, and a core layer configured to propagate an optical signal, the core layer being formed in the cladding layer in a predetermined pattern.

4. A photocurable film for forming an optical waveguide core layer, which is obtained by forming the optical waveguide photosensitive resin composition of claim 1 into a film shape.

5. An optical waveguide, comprising:
a base material;
a cladding layer formed on the base material; and
a core layer configured to propagate an optical signal, the core layer being formed in the cladding layer in a predetermined pattern,
wherein the core layer is formed by curing the optical waveguide photosensitive resin composition of claim 1.

6. A mixed flexible printed circuit board for optical/electrical transmission, comprising the optical waveguide of claim 5.

7. An optical waveguide, comprising:
a base material;
a cladding layer formed on the base material; and
a core layer configured to propagate an optical signal, the core layer being formed in the cladding layer in a predetermined pattern,
wherein the core layer is formed by curing the photocurable film for forming the optical waveguide core layer of claim 4.

8. A mixed flexible printed circuit board for optical/electrical transmission, comprising the optical waveguide of claim 7.

* * * * *